US010985209B2

(12) United States Patent
Nakayama et al.

(10) Patent No.: US 10,985,209 B2
(45) Date of Patent: Apr. 20, 2021

(54) NONVOLATILE STORAGE DEVICE

(71) Applicant: TOSHIBA MEMORY CORPORATION, Tokyo (JP)

(72) Inventors: Masahiko Nakayama, Kuwana Mie (JP); Kazumasa Sunouchi, Yokohama Kanagawa (JP); Gaku Sudo, Yokkaichi Mie (JP); Tadashi Kai, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/559,162

(22) Filed: Sep. 3, 2019

(65) Prior Publication Data

US 2020/0303453 A1    Sep. 24, 2020

(30) Foreign Application Priority Data

Mar. 20, 2019  (JP) .............................. JP2019-052653

(51) Int. Cl.
*H01L 27/22* (2006.01)
*G11C 11/16* (2006.01)
*H01L 43/02* (2006.01)
*H01L 43/10* (2006.01)

(52) U.S. Cl.
CPC ............ *H01L 27/224* (2013.01); *H01L 43/02* (2013.01); *G11C 11/161* (2013.01); *H01L 43/10* (2013.01)

(58) Field of Classification Search
CPC ....... H01L 27/224; H01L 43/02; H01L 43/10; G11C 11/161
USPC .................................. 257/421, 422; 438/48
See application file for complete search history.

(56) References Cited

U.S. PATENT DOCUMENTS

| | | | |
|---|---|---|---|
| 7,746,680 B2 | 6/2010 | Scheuerlein et al. | |
| 9,087,769 B2 | 7/2015 | Kim et al. | |
| 2012/0039110 A1* | 2/2012 | Maejima et al. | ............. 365/148 |
| 2016/0181319 A1 | 6/2016 | Tanaka et al. | |
| 2016/0379701 A1 | 12/2016 | Nakatsuka et al. | |
| 2017/0077177 A1 | 3/2017 | Shimomura et al. | |

FOREIGN PATENT DOCUMENTS

| | | |
|---|---|---|
| JP | 5423944 B2 | 2/2014 |
| WO | 2015141626 A1 | 4/2017 |

* cited by examiner

*Primary Examiner* — Thinh T Nguyen
(74) *Attorney, Agent, or Firm* — Kim & Stewart LLP

(57) ABSTRACT

A nonvolatile storage device includes first interconnections extending in a first direction and second interconnections extending in a second direction intersecting the first direction. Memory cells are formed at intersections between first and second interconnections. Each memory cell includes a resistance change element and a selector. In the arrangement of memory cells, all memory cells that are connected to any particular first interconnection are aligned along that first interconnection, and all memory cells connected to any particular second interconnection are alternately staggered in the first direction across a width of that second interconnection.

10 Claims, 5 Drawing Sheets

NONVOLATILE STORAGE DEVICE

CROSS-REFERENCE TO RELATED APPLICATION(S)

This application is based upon and claims the benefit of priority from Japanese Patent Application No. 2019-052653, filed Mar. 20, 2019, the entire contents of which are incorporated herein by reference.

FIELD

Embodiments described herein relate generally to a nonvolatile storage device.

BACKGROUND

A nonvolatile storage device having memory cells including resistance change storage elements, such as magnetoresistive elements, and switching elements integrated on a semiconductor substrate has been proposed.

However, to obtain a highly integrated nonvolatile storage device, the distance between adjacent memory cells typically becomes smaller and the thus influence from adjacent memory cells disadvantageously increases.

It is, therefore, desirable to provide a nonvolatile storage device with a relatively large distance between the adjacent memory cells.

DETAILED DESCRIPTION

In general, according to one embodiment, a nonvolatile storage device includes: a plurality of first interconnections extending in a first direction and a plurality of second interconnections extending in a second direction intersecting the first direction. The storage device also includes a plurality of memory cells. Each memory cell is at an intersection between a first interconnection and a second interconnection and includes a resistance change element and a selector. All memory cells connected to any particular first interconnection are aligned along the particular first interconnection. All memory cells connected to any particular second interconnection are alternately staggered in the first direction across a width of the particular second interconnection.

Example embodiment will be described with reference to the drawings. These examples are non-limiting.

Figure 1:
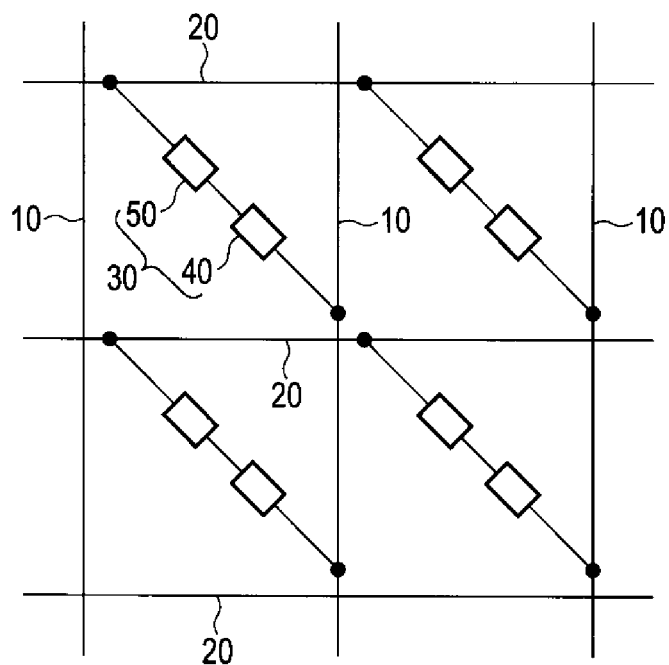
FIG. 1 is an equivalent circuit diagram depicting a configuration of a nonvolatile storage device according to an embodiment.
Figure 2:
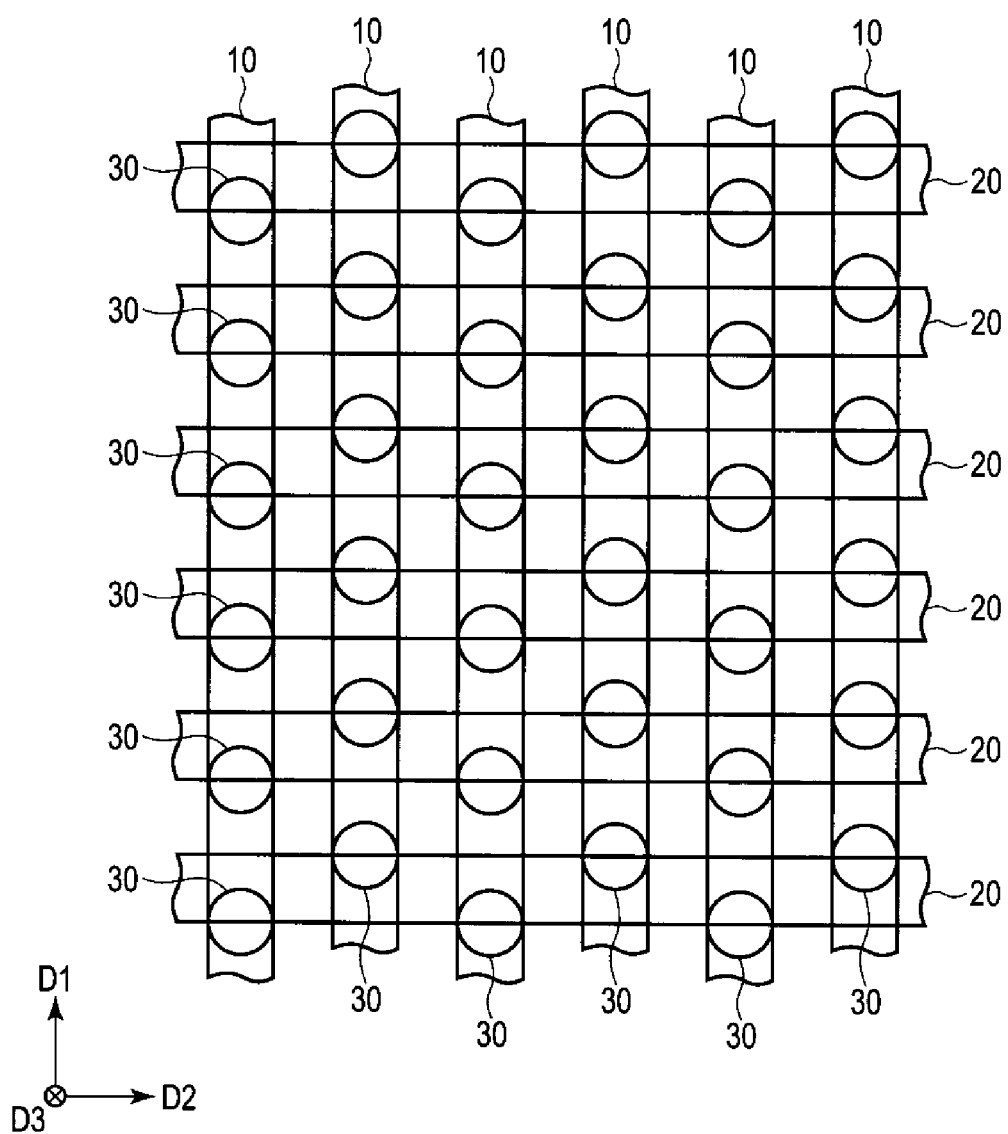
FIG. 2 is a plan view schematically depicting the configuration of the nonvolatile storage device according to an embodiment.
Figure 3:
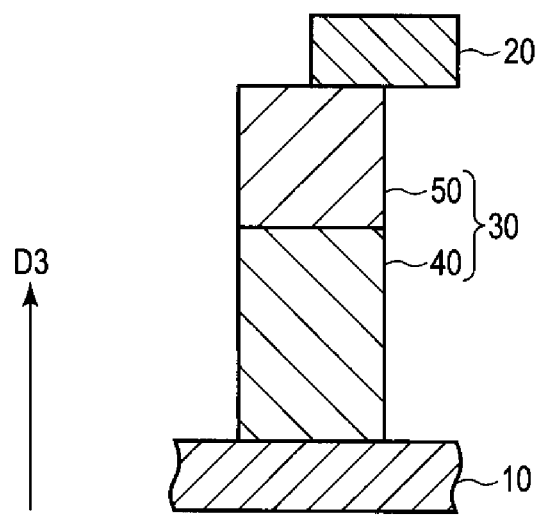
FIG. 3 is a cross-sectional view schematically depicting an example of the configuration of the nonvolatile storage device according to an embodiment.

FIG. 1 is an equivalent circuit diagram depicting a configuration of a nonvolatile storage device according to the embodiment. The nonvolatile storage device may also be referred to as a semiconductor integrated circuit device. FIG. 2 is a plan view schematically depicting a configuration of a nonvolatile storage device. FIG. 3 is a cross-sectional view schematically depicting a configuration of a nonvolatile storage device according to an embodiment. More particularly, FIG. 3 is across-sectional view in a direction parallel to direction D1 of FIG. 2.

The nonvolatile storage device according to the embodiment has memory cells 30 between first interconnections 10 and second interconnections 20. A memory cell 30 can be selected using a first interconnection 10 and a second interconnection 20. The first interconnections 10, the second interconnections 20, and the memory cells 30 are provided on a principal surface side of a semiconductor substrate (not specifically depicted). Transistors, interconnections, and the like for peripheral circuits are also provided on the principal surface of the semiconductor substrate.

The first interconnections 10 extend in the first direction D1, while the second interconnections 20 extend in a second direction D2. The first interconnections 10 intersect the second interconnections 20. In the present embodiment, the first interconnections 10 are orthogonal to the second interconnections 20. That is, the first direction D1 is orthogonal to the second direction D2. In the present embodiment, the first interconnections 10 are provided on a lower layer side than the memory cells 30, while the second interconnections 20 are provided on an upper layer side of the memory cells 30. That is, the first interconnections 10 are lower-layer interconnections and the second interconnections 20 are upper-layer interconnections. The first interconnections 10 and the second interconnections 20 can be either utilized as a word line or a bit line depending on implemented design choices in the overall device. If the first interconnections 10 are used as word lines, then the second interconnections 20 are used as bit lines and vice versa.

Each memory cell 30 is connected between a corresponding first interconnection 10 and a corresponding second interconnection 20. In each memory cell 30 a magnetoresistive element 40 and a selector 50 are connected in series. The magnetoresistive element 40 may be referred to as a nonvolatile resistance change storage element. Specifically, each memory cell 30 has a structure such that a magnetoresistive element 40 and a selector 50 are stacked.

From a third direction D3, that is, from a direction of stacking of the magnetoresistive element 40 and the selector 50, the memory cells 30 are linearly arranged to correspond to the first interconnections 10. Furthermore, the memory cells 30 are arranged to be alternately staggered across the width direction (direction D1) along the length (direction D2) of second interconnections 20.

In an ideal case without issues such as lithographic misalignment or the like, the memory cells 30 are arranged to align with a center line of each first interconnection 10. Furthermore, the memory cells 30 are disposed equidistantly along the length of each first interconnection 10 in the direction D1.

The memory cells 30 are arranged to be alternately staggered above and below, in direction D1, the center line of the second interconnections 20. The memory cells 30 connected to a second interconnection 20 are ideally equal in the staggering (offset) amount with respect to offset of the center line of the respective second interconnection 20.

Figure 4:
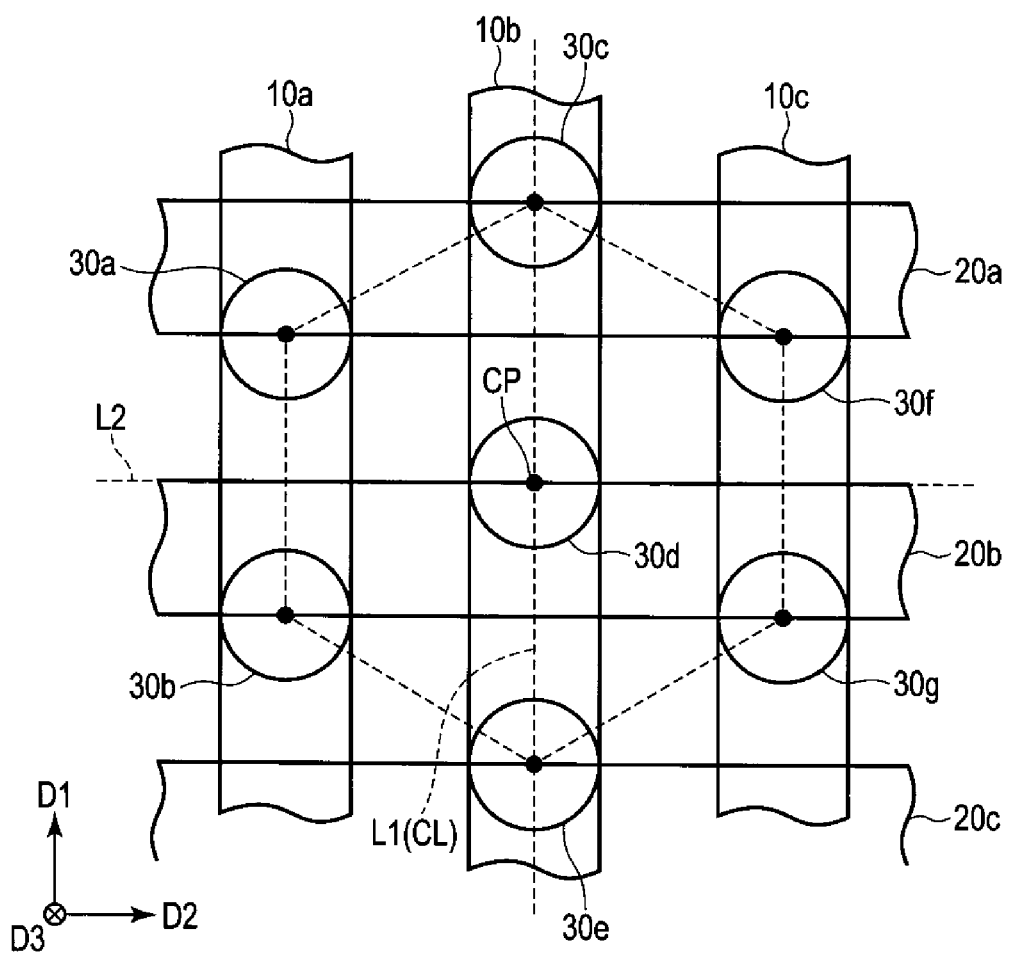
FIG. 4 is a plan view schematically depicting the arrangement of first interconnections, second interconnections, and memory cells in the nonvolatile storage device according to an embodiment.

FIG. 4 is a plan view schematically depicting an arrangement of the first interconnections 10, the second interconnections 20, and the memory cells 30, and corresponds to a partially enlarged view of FIG. 2.

As depicted in FIG. 4, it is assumed that three consecutive first interconnections 10 are the first interconnections 10a, 10b, and 10c and that three consecutive second interconnections 20 are the second interconnections 20a, 20b, and 20c.

As depicted in FIG. 4, three consecutive memory cells 30b, 30d, and 30g are connected to the second interconnection 20b. These three consecutive memory cells 30b, 30d, and 30g are referred to a first memory cell 30b, a second memory cell 30d, and a third memory cell 30g, respectively. The first memory cell 30b and the third memory cell 30g are disposed at symmetric positions about a line L1 passing through a center point CP of the second memory cell 30d and parallel to the first direction D1. Ideally, the first memory cell 30b and the third memory cell 30g are disposed at symmetric positions about a center line CL of the first interconnection 10b. In this case, the line L1 coincides with the center line CL.

A hexagon connecting center points of six memory cells 30a, 30b, 30c, 30e, 30f, and 30g surrounding memory cell 30d is twofold symmetric. The hexagon is line-symmetric about the line L1 passing through the center point CP of the memory cell 30d and parallel to the first direction D1, and is also line-symmetric about a line L2 passing through the center point CP of the memory cell 30d and parallel to the second direction D2. It is also preferable that the hexagon is a regular hexagon. That is, it is desirable to optimize a pitch of the first interconnections 10 and a pitch of the second interconnections 20 so that the hexagon is the regular hexagon.

Figure 5:
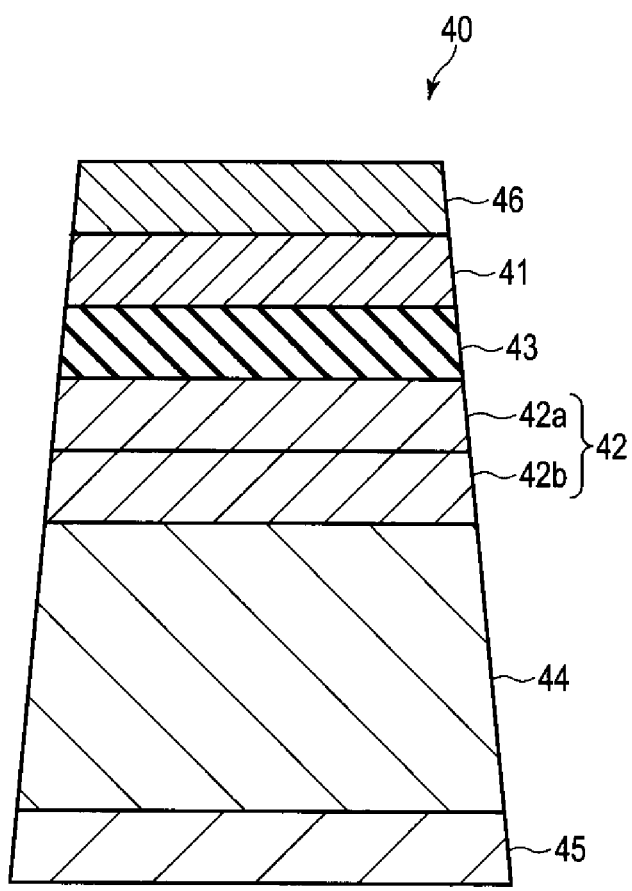
FIG. 5 is a cross-sectional view schematically depicting an example of a specific configuration of a magnetoresistive element used in the nonvolatile storage device according to an embodiment.

FIG. 5 is a cross-sectional view schematically depicting a specific configuration of the magnetoresistive element 40 used in a nonvolatile storage device according to the present embodiment. It is noted that the magnetoresistive element is also referred to as a magnetic tunnel junction (MTJ) element.

The magnetoresistive element 40 includes a storage layer 41, a reference layer 42, a tunnel barrier layer 43, a shift canceling layer 44, a foundation layer 45, and a cap layer 46.

The storage layer 41 is formed with a ferromagnetic material and has a variable magnetization direction. The variable magnetization direction means a magnetization direction that varies with a predetermined write current. The storage layer 41 is formed with a ferromagnetic material having, for example, perpendicular magnetic properties. The storage layer 41 comprises at least one of iron (Fe) and cobalt (Co). The storage layer 41 may further include boron (B).

The reference layer 42 is formed with a ferromagnetic material and has a pinned magnetization direction. The pinned magnetization direction means a magnetization direction that does not vary with the predetermined write current. The reference layer 42 includes a first layer portion 42a that is adjacent to the tunnel barrier layer 43 and a second layer portion 42b that is not directly adjacent to the tunnel barrier layer 43. The first layer portion 42a is formed with a ferromagnetic material having, for example, perpendicular magnetic properties, and comprises iron (Fe), cobalt (Co), and boron (B). The second layer portion 42b is formed with a ferromagnetic material having, for example, perpendicular magnetic properties, and comprises at least one element selected from among cobalt (Co), platinum (Pt), nickel (Ni), and palladium (Pd).

The tunnel barrier layer 43 is an insulating layer between the storage layer 41 and the reference layer 42, and comprises magnesium (Mg) and oxygen (O).

The shift canceling layer 43 is formed with a ferromagnetic material, has a pinned magnetization direction, antiparallel to the magnetization direction of the reference layer 42, and functions to cancel a magnetic field applied from the reference layer 42 to the storage layer 41. The shift canceling layer 43 is formed with a ferromagnetic material having, for example, perpendicular magnetic properties, and comprises at least one element selected from among cobalt (Co), platinum (Pt), nickel (Ni), and palladium (Pd).

The magnetoresistive element 40 described above is a spin transfer torque (STT) type magnetoresistive element and exhibits perpendicular magnetization. That is, the magnetization direction of the storage layer 41 is a direction perpendicular to a principal surface of the storage layer 41, the magnetization direction of the reference layer 42 is a direction perpendicular to a principal surface of the reference layer 42, and the magnetization direction of the shift canceling layer 44 is a direction perpendicular to a principal surface of the shift canceling layer 44.

The magnetoresistive element 40 has a low resistance state in which the magnetization direction of the storage layer 41 is parallel to the magnetization direction of the reference layer 42 and a high resistance state in which the magnetization direction of the storage layer 41 is antiparallel to the magnetization direction of the reference layer 42. The magnetoresistive element 40 can, therefore, store binary data (0 or 1) according to the resistance state (low resistance state or high resistance state). The low resistance state or the high resistance state may be set in the magnetoresistive element 40 depending on the direction of a current fed through the magnetoresistive element 40.

Figure 6:
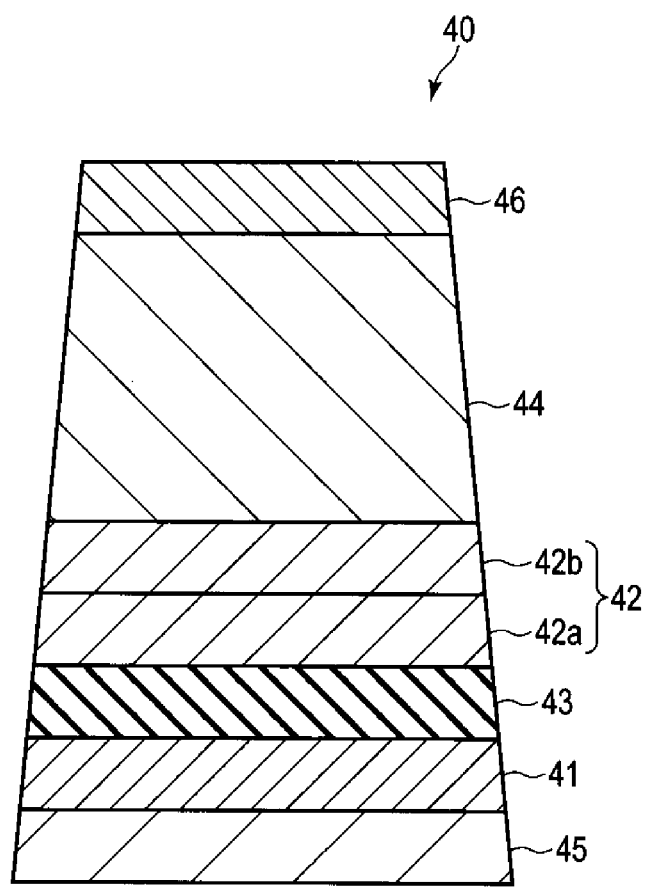
FIG. 6 is a cross-sectional view schematically depicting another example of the specific configuration of the magnetoresistive element used in the nonvolatile storage device according to an embodiment.

While the magnetoresistive element 40 depicted in FIG. 5 has a top free type configuration such that the reference layer 42, the tunnel barrier layer 43, and the storage layer 41 are stacked in order on a lower layer side (e.g., semiconductor substrate side), the magnetoresistive element 40 may instead have a bottom free type configuration such that the storage layer 41, the tunnel barrier layer 43, and the reference layer 42 are stacked in order from the lower layer side as depicted in FIG. 6.

The selector 50 is used to select the magnetoresistive element 40 and has a switching function. For example, a two-terminal type switching element is used as the selector 50. When the selector 50 is turned on, then the magnetoresistive element 40 is considered selected, and data can be written to and read from the magnetoresistive element 40. As a selector 50, a diode or a two-terminal type switching element containing a chalcogen element may be used.

The two-terminal type switching element containing a chalcogen element is in a high resistance state (for example, an electrically non-conducting state) when a voltage applied across two terminals is lower than a threshold voltage. When the voltage applied across the two terminals is higher than the threshold voltage, the switching element transitions into a low resistance state (for example, an electrically conducting state). The switching element may function bi-directionally. The switching element may contain at least one chalcogen element selected from a group consisting of tellurium (Te), selenium (Se), and sulfur (S). Alternatively, the switching element may contain chalcogenide which is a compound comprising a chalcogen element. Furthermore, the switching element may contain one or more elements selected from a group consisting of boron (B), aluminum (Al), gallium (Ga), indium (In), carbon (C), silicon (Si), germanium (Ge), tin (Sn), arsenic (As), phosphorous (P), and antimony (Sb).

The memory cells 30 connected to an interconnection 10 are arranged linearly, and the memory cells 30 connected to a second interconnection 20 are alternately staggered along the second interconnection 20. With such a configuration, it is possible provide a nonvolatile storage device with a relatively large a distance between adjacent memory cells 30 and thus limit the influence of the adjacent memory cells 30.

Ion beam etching (IBE) is widely used for patterning magnetoresistive elements. However, when distance between the adjacent magnetoresistive elements is small, a shadowing effect may prevent the magnetoresistive elements from being adequately processed. Additionally, when the distance between the adjacent magnetoresistive elements is small, an influence of magnetic fields from the adjacent magnetoresistive elements disadvantageously increases. It is therefore preferable to have a relatively large distance between adjacent memory cells.

Disposing the memory cells in a hexagonal fashion as described in the present embodiment makes it possible to keep a large distance between the adjacent memory cells. However, simply arranging the first interconnections and the second interconnections in conformity with a hexagonal arrangement of memory cells would cause the first interconnections and the second interconnections to intersect one another at oblique angles. It is considered not easy to precisely form such oblique interconnections.

In the present embodiment, the memory cells 30 are arranged to be alternately staggered along second interconnections 20; thus, it is possible to obtain a nonvolatile storage device capable keeping a large distance between the adjacent memory cells 30 without necessitating obliquely angled interconnections.

Moreover, symmetrically arranging the memory cells 30, as depicted in FIG. 4, makes it possible to cancel the influence of the magnetic fields from the adjacent memory cells.

In the present embodiment, the first interconnections 10 are provided on a lower layer than the memory cells 30. Owing to this, it is possible to form the memory cells 30 on a flat surface. If the second interconnections 20 were provided below the memory cells 30, the memory cells 30 would be formed on a region including edges of the second interconnections 20. This makes it difficult to form the memory cells 30 on the flat surface. In the present embodiment, it is possible to form the memory cells 30 on the flat surface since the first interconnections 10 are provided on the lower layer side of the memory cells 30.

Figure 7:
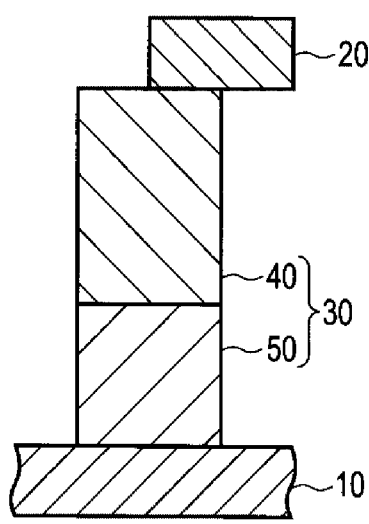
FIG. 7 is a cross-sectional view schematically depicting another example of the configuration of the nonvolatile storage device according to an embodiment.

While the nonvolatile storage device is configured to provide the selector 50 on the magnetoresistive element 40, as depicted in FIG. 3, the nonvolatile storage device may instead be configured to provide the magnetoresistive element 40 on the selector 50, as depicted in FIG. 7.

Moreover, while the magnetoresistive element 40 is used as a nonvolatile resistance change storage element in the embodiment described above, other nonvolatile resistance change storage elements may be used.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A nonvolatile storage device, comprising:
   a plurality of first interconnections extending in a first direction;
   a plurality of second interconnections extending in a second direction intersecting the first direction; and
   a plurality of memory cells, each memory cell being at an intersection between a first interconnection and a second interconnection, each memory cell including a resistance change element and a selector, wherein
   all memory cells connected to any particular first interconnection are aligned along the particular first interconnection, and all memory cells connected to any particular second interconnection are alternately staggered in the first direction across a width of the particular second interconnection.

2. The nonvolatile storage device according to claim 1, wherein the first direction is orthogonal to the second direction.

3. The nonvolatile storage device according to claim 1, wherein the plurality of first interconnections are on a substrate side of the plurality of memory cells.

4. The nonvolatile storage device according to claim 1, wherein the memory cells connected to any particular first interconnection are centered in the second direction with respect to a width of the particular first interconnection.

5. The nonvolatile storage device according to claim 1, wherein the memory cells connected to the particular first interconnection are spaced equidistant from each other along the first direction.

6. The nonvolatile storage device according to claim 1, wherein the memory cells connected to the particular second interconnection are alternately staggered across a center line of the particular second interconnection.

7. The nonvolatile storage device according to claim 1, wherein each memory cell connected to the particular second interconnection is substantially centered on an edge of the particular second interconnection.

8. The nonvolatile storage device according to claim 1, wherein, for three consecutive memory cells of the memory cells connected to the same second interconnection, the outer two of the three consecutive memory cells are at symmetric positions about a line passing through a center point of the center memory cell of the three consecutive memory cells, and the line is parallel to the first direction.

9. The nonvolatile storage device according to claim 1, wherein, for three consecutive memory cells connected to the same second interconnection, the outer two of the three consecutive memory cells are at symmetric positions about a center line of one of the particular first interconnection to which the center memory cell of the three consecutive memory cells is connected.

10. The nonvolatile storage device according to claim 1, wherein the resistance change element is a magnetoresistive element.

* * * * *